United States Patent
Ide et al.

(10) Patent No.: US 8,476,899 B2
(45) Date of Patent: Jul. 2, 2013

(54) MAGNETIC SENSOR AND MAGNETIC BALANCE TYPE CURRENT SENSOR INCLUDING THE SAME

(75) Inventors: Yosuke Ide, Niihata-Ken (JP);
Masamichi Saito, Niigata-Ken (JP);
Akira Takahashi, Niigata-Ken (JP);
Kenji Ichinohe, Niigata-Ken (JP);
Yoshihiro Nishiyama, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 276 days.

(21) Appl. No.: 13/038,307

(22) Filed: Mar. 1, 2011

(65) Prior Publication Data
US 2011/0221435 A1    Sep. 15, 2011

(30) Foreign Application Priority Data

Mar. 11, 2010  (JP) ................................ 2010-054725

(51) Int. Cl.
*G01R 33/09*    (2006.01)
(52) U.S. Cl.
USPC ..................................... 324/252; 324/207.21
(58) Field of Classification Search
USPC ............................................ 324/207.21, 252
See application file for complete search history.

(56) References Cited

U.S. PATENT DOCUMENTS

| 6,255,814 B1* | 7/2001 | Shimazawa et al. .......... 324/252 |
| 6,418,335 B2* | 7/2002 | Avrin et al. .................... 600/409 |
| 6,429,640 B1* | 8/2002 | Daughton et al. ......... 324/117 R |
| 8,269,491 B2* | 9/2012 | Cummings et al. ........... 324/252 |
| 2008/0211490 A1* | 9/2008 | Kurata et al. ............ 324/207.21 |
| 2008/0274270 A1* | 11/2008 | Wakui et al. .................. 427/128 |

FOREIGN PATENT DOCUMENTS

JP    2005-183614    7/2005

\* cited by examiner

*Primary Examiner* — Bot Ledynh
(74) *Attorney, Agent, or Firm* — Beyer Law Group LLP

(57) ABSTRACT

A magnetic sensor includes a magnetoresistance effect element and a hard bias layer. The magnetoresistance effect element is configured to have a striped form which has a sensitivity axis in a predetermined direction, and configured to have a structure in which a free magnetic layer, in which magnetization varies with respect to an external magnetic field, a non-magnetic layer, and a fixed magnetic layer, in which the magnetization is fixed, are laminated. The hard bias layer is disposed in a longitudinal direction of the striped form, disposed outside of the magnetoresistance effect element to be separated from the magnetoresistance effect element.

7 Claims, 7 Drawing Sheets

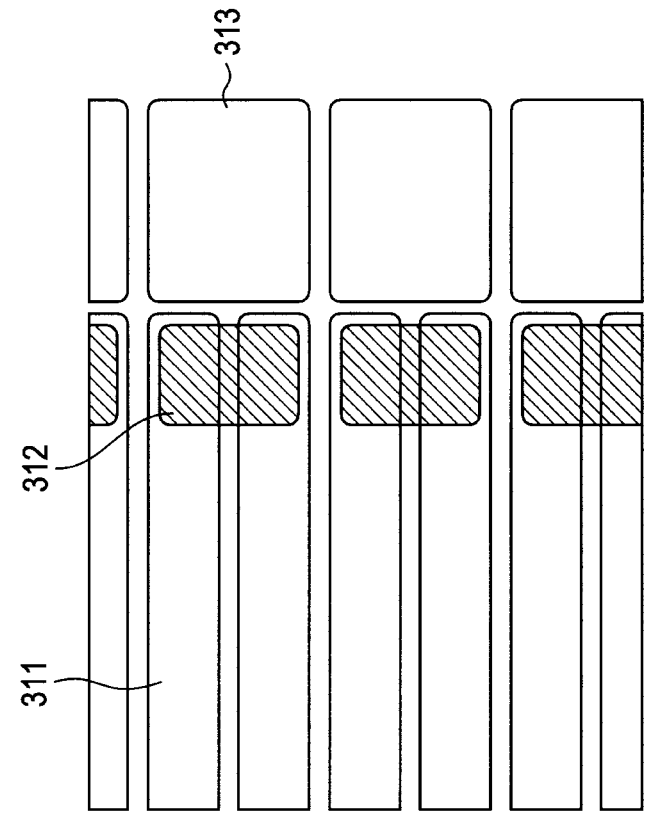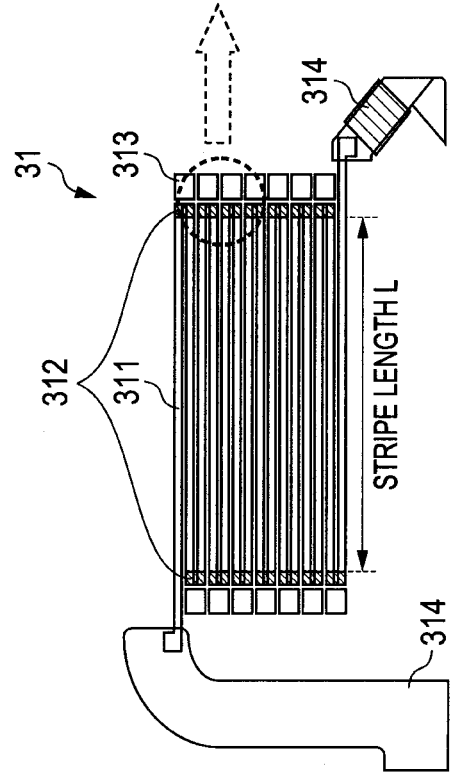

IN DIRECTION AWAY
FROM + DIRECTION

MAGNETIC SENSOR AND MAGNETIC BALANCE TYPE CURRENT SENSOR INCLUDING THE SAME

CLAIM OF PRIORITY

This application claims benefit of Japanese Patent Application No. 2010-054725 filed on Mar. 11, 2010 which is hereby incorporated by reference.

BACKGROUND OF THE INVENTION

1. Field of the Invention

The invention relates to a magnetic sensor using a magnetoresistance effect element (a tunnel magnetoresistance (TMR) element or a giant magnetoresistance (GMR) element) and a magnetic balance type current sensor including the same.

2. Description of the Related Art

As a magnetic detection element used for a magnetic sensor, a magnetoresistance effect element, for example, a GMR element, has been used. The GMR element includes an antiferromagnetic layer, a fixed magnetic layer, a non-magnetic material layer, and a free magnetic layer as a basic film configuration. The fixed magnetic layer is formed to come into contact with the antiferromagnetic layer, and a magnetization direction is fixed in a single direction attributable to an exchange coupling magnetic field (Hex) generated between the fixed magnetic layer and the antiferromagnetic layer. Further, the free magnetic layer is laminated through the fixed magnetic layer and the non-magnetic material layer (non-magnetic layer). The magnetization of the free magnetic layer is not fixed and magnetized with respect to an external magnetic field. Further, electrical resistance varies due to the relationship between the magnetization direction of the free magnetic layer and the magnetization direction of the fixed magnetic layer. In such a magnetic sensor, in order to increase the linear relationship (linearity) between the resistance of the magnetoresistance effect element and the strength of the external magnetic field, a magnetic sensor in which hard bias layers are provided on the outside of the magnetoresistance effect element has been provided (Japanese Unexamined Patent Application Publication No. 2005-183614).

A magnetic sensor disclosed in Japanese Unexamined Patent Application Publication No. 2005-183614 includes a configuration in which the longitudinal directions of a plurality of stripe-shaped magnetoresistance effect elements are disposed such that the longitudinal directions of the magnetoresistance effect elements are parallel to each other, and in which a hard bias layer is provided on the ends of two adjacent stripe-shaped magnetoresistance effect elements. In the magnetic sensor, the hard bias layer is formed to serve as an electrode and to be laid on the ends of two adjacent stripe-shaped magnetoresistance effect elements.

SUMMARY OF THE INVENTION

However, in the magnetic sensor described in Japanese Unexamined Patent Application Publication No. 2005-183614, a hard bias layer serves as an electrode, so that current flows through the hard bias layer. Therefore, there is a problem in that the hard bias layer generates heat, so that a coercivity force decreases. Further, in this magnetic sensor, the hard bias layer is formed to be laid on magnetoresistance effect elements at a narrow pitch, with the result that adjacent hard bias layers come into contact with each other, so that there is a possibility of a short circuit.

The present invention provides a magnetic sensor and a magnetic balance type current sensor including the same in which the heat generation and short circuiting of a hard bias layer are not generated, and in which the linear relationship (linearity) between the resistance and the strength of an external magnetic field is excellent.

A magnetic sensor according to an embodiment of the invention includes a magnetoresistance effect element configured to have a striped form which has a sensitivity axis in a predetermined direction, and configured to have a structure in which a free magnetic layer, in which magnetization varies with respect to an external magnetic field, a non-magnetic layer, and a fixed magnetic layer, in which magnetization, is fixed are laminated; and a hard bias layer disposed in a longitudinal direction of the striped form, and disposed outside of the magnetoresistance effect element, wherein the hard bias layer is separated from the magnetoresistance effect element.

According to the embodiment, the hard bias layer for fixing the magnetization of the fixed magnetic layer of a magnetoresistance effect element is disposed in a longitudinal direction of the striped form, disposed outside of the magnetoresistance effect element to be separated from the magnetoresistance effect element, so that the heat generation and short-circuiting of the hard bias layer can be prevented.

In the magnetic sensor according to the embodiment of the invention, it is preferable that the length of the longitudinal direction of the magnetoresistance effect element be in the range of 60 μm to 380 μm.

In the magnetic sensor according to the embodiment of the invention, it is preferable that the length of the width direction of the magnetoresistance effect element is in the range of 2 μm to 9 μm.

In the magnetic sensor according to the embodiment of the invention, it is preferable that the distance between the hard bias layer and the magnetoresistance effect element is equal to or less than 3 μm.

In the magnetic sensor according to the embodiment of the invention, it is preferable that the thickness of the hard bias layer is equal to or larger than 40 nm.

In the magnetic sensor according to the embodiment of the invention, it is preferable that the magnetoresistance effect element is a spin valve type giant magnetoresistance (GMR) element or a spin valve type tunnel magnetoresistance (TMR) element.

A magnetic balance type current sensor according to an embodiment of the invention includes a magnetic sensor of which characteristics vary due to an induction magnetic field from measured current; and a feedback coil which is disposed adjacent to the magnetic sensor, and configured to generate a canceling magnetic field which offsets the induction magnetic field.

The magnetic sensor according to an embodiment of the invention includes a striped form having a sensitivity axis in the predetermined direction, and includes a magnetoresistance effect element having the laminated structure of a free magnetic layer magnetized with respect to an external magnetic field, a non-magnetic layer, and a fixed magnetic layer in which magnetization is fixed; and hard bias layer disposed in a longitudinal direction of the striped form, disposed outside of the magnetoresistance effect element to be separated from the magnetoresistance effect element, so that the heat generation and short-circuiting of the hard bias layer can be prevented, and the linear relationship (linearity) between the resistance and the strength of the external magnetic field can be improved.

BRIEF DESCRIPTION OF THE DRAWINGS

FIG. 3A is a view illustrating the magnetic sensor according to the embodiment of the invention, and FIG. 3B is an enlarged view of FIG. 3A;

DESCRIPTION OF THE PREFERRED EMBODIMENTS

Hereinafter, the embodiments of the invention will be described in detail with reference to the accompanying drawings. Furthermore, although a case where a magnetic sensor according to an embodiment of the invention is applied to a magnetic balance type current sensor has been described in the present specification, the magnetic sensor according to the embodiment of the invention is not limited thereto and can be applied to other devices.

Figure 1:
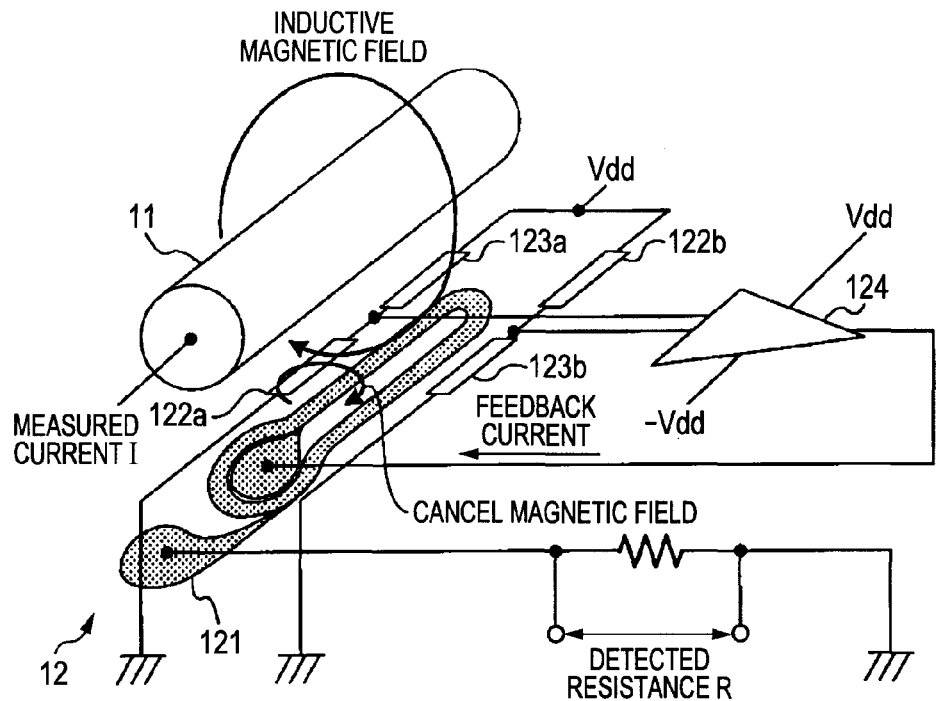
FIG. 1 is a view illustrating a magnetic balance type current sensor including a magnetic sensor according to an embodiment of the invention.
Figure 2:
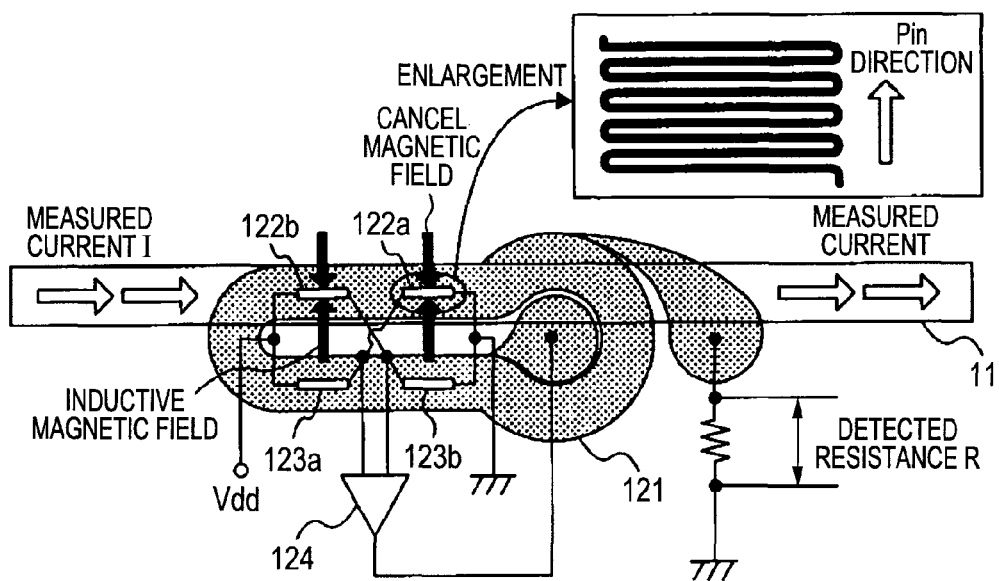
FIG. 2 is a view illustrating the magnetic balance type current sensor including the magnetic sensor according to the embodiment of the invention.

FIGS. 1 and 2 are views illustrating a magnetic balance type current sensor including a magnetic sensor according to an embodiment of the invention. In this embodiment, the magnetic balance type current sensor shown in FIGS. 1 and 2 is arranged adjacent to the conductor 11 through which measured current I flows. The magnetic balance type current sensor includes a feedback circuit 12 for generating a magnetic field (cancel magnetic field) which negates an induction magnetic field attributable to the measured current I which flows through the conductor 11. The feedback circuit 12 includes a feedback coil 121 wound in the direction which negates the magnetic field generated due to the measured current I, and two magnetoresistance effect elements 122a and 122b which are magnetism detection elements, and two fixed resistor elements 123a and 123b.

The feedback coil 121 is configured with a planar coil. In this configuration, a magnetic core is not used, so that the feedback coil can be made at low cost. Further, as compared with the case of a toroidal coil, a canceling magnetic field generated from the feedback coil can be prevented from being spread over a wide range, thereby avoiding affecting circuits in the vicinity. Further, as compared with the case of the toroidal coil, when the measured current is alternating current, the canceling magnetic field can be easily controlled by the feedback coil, and current which flows to perform control is not very large. Such an effect gets larger when the measured current is alternating current and the frequency becomes higher. When the feedback coil 121 is configured with the planar coil, it is preferable that the planar coil is provided such that both the induction magnetic field and the canceling magnetic field are generated within a surface which is parallel to the formation surface of the planar coil.

The resistance of the magnetoresistance effect elements 122a and 122b varies due to the application of the induction magnetic field from the measured current I. The two magnetoresistance effect elements 122a and 122b are included in the magnetic field detection bridge circuit, together with the two fixed resistor elements 123a and 123b. A high sensitivity magnetic balance type current sensor can be implemented using the magnetic field detection bridge circuit including the magnetoresistance effect elements as described above.

The magnetic field detection bridge circuit includes two outputs for generating voltage difference based on the induction magnetic field generated by the measured current I. In the magnetic field detection bridge circuit shown in FIG. 2, a voltage source Vdd is connected to the connection point between the magnetoresistance effect element 122b and the fixed resistor element 123a, and a ground (GND) is connected to the connection point between the magnetoresistance effect element 122a and the fixed resistor element 123b. Furthermore, in the magnetic field detection bridge circuit, an output is extracted from the connection point between the magnetoresistance effect element 122a and the fixed resistor element 123a, and another output is extracted from the connection point between the magnetoresistance effect element 122b and the fixed resistor element 123b. These two outputs are amplified by an amplifier 124, and provided to the feedback coil 121 as current (feedback current). The feedback current corresponds to voltage difference based on the induction magnetic field. At this time, a canceling magnetic field which offsets the induction magnetic field is generated on the feedback coil 121. Therefore, the measured current is measured by a detection unit (detection resistor R) based on current which flows through the feedback coil 121 at an equilibrium state where the induction magnetic field and the canceling magnetic field are offset.

FIG. 3A is a view illustrating the magnetic sensor according to the embodiment of the invention, and FIG. 3B is the enlarged view of FIG. 3A. As shown in FIG. 3A, a magnetic sensor 31 includes a magnetoresistance effect element 311 having a striped form. The magnetoresistance effect element 311 includes a plurality of stripe-shaped long patterns disposed such that the longitudinal directions thereof are parallel to each other. With respect to the ends of each pair of the long patterns, two adjacent long patterns are connected by a non-magnetic layer 312 in the vertical direction to the longitudinal direction of the long patterns as shown in FIG. 3B. The non-magnetic layer 312 is formed to connect different long patterns at both ends of each of the patterns. That is, the first long pattern and the second long pattern from the upper side are connected at the right side end portion (end portion of one side) toward the drawing by a non-magnetic layer 312, and the second long pattern and the third long pattern from the upper side are connected at the left side end portion (end portion of the other side) toward the drawing by a non-magnetic layer 312 as shown in FIG. 3A. Therefore, two long patterns which are adjacent to each other at the right and left end portions are connected by a non-magnetic layer 312. The material of a non-magnetic layer 312 may be Cu, Au, or Al which have low resistance values.

Therefore, the magnetoresistance effect element 311 has a striped form. In the striped form, a sensitivity axis direction is a Pin direction (vertical direction to the longitudinal direction of the magnetoresistance effect element: the width direction of the magnetoresistance effect element) shown in FIG. 2. Here, the stripe length (the length of longitudinal direction) L of the magnetoresistance effect element 311 refers to the length of the long pattern corresponding to a range except for the area of non-magnetic layers 312 of the long pattern, as shown in FIG. 3A. The reason for this is that the areas in which the non-magnetic layers 312 are formed on the magnetoresistance effect element 311 do not contribute to the magnetoresistance effect.

A TMR element (Tunnel-type MagnetoResistance effect element) or a GMR element (Giant MagnetoResistance effect element) can be used as the magnetoresistance effect element 311. For example, a spin valve type GMR element or a spin valve type TMR element configured with multilayer films which include an antiferromagnetic layer, a fixed magnetic layer, a non-magnetic layer, and a free magnetic layer can be used as the GMR element. The free magnetic layer is a magnetic layer in which magnetization varies with respect to the external magnetic field, and the fixed magnetic layer is a magnetic layer in which magnetization is fixed. With respect to the fixed magnetic layer, magnetization is fixed by the antiferromagnetic layer. A hard bias layer 313 is disposed outside of the magnetoresistance effect element 311 in the longitudinal direction of the striped form. Further, the hard bias layer 313 is disposed in such a way that the hard bias layer 313 is separated from the end portions of the magnetoresistance effect element 311. In the configuration shown in FIGS. 3A and 3B, the hard bias layer 313 is provided to have the same width (the length of longitudinal direction (width direction, sensitivity axis direction) with respect to the plane of paper) as the width of the non-magnetic layer 312 which connects the end portions of the long patterns of the magnetoresistance effect element 311. Meanwhile, in FIG. 3A, reference numeral 314 indicates a wiring which is connected to the magnetic sensor 31. Further, CoPt or CoCrPt can be cited as the material of the hard bias layer 313.

Figure 4:
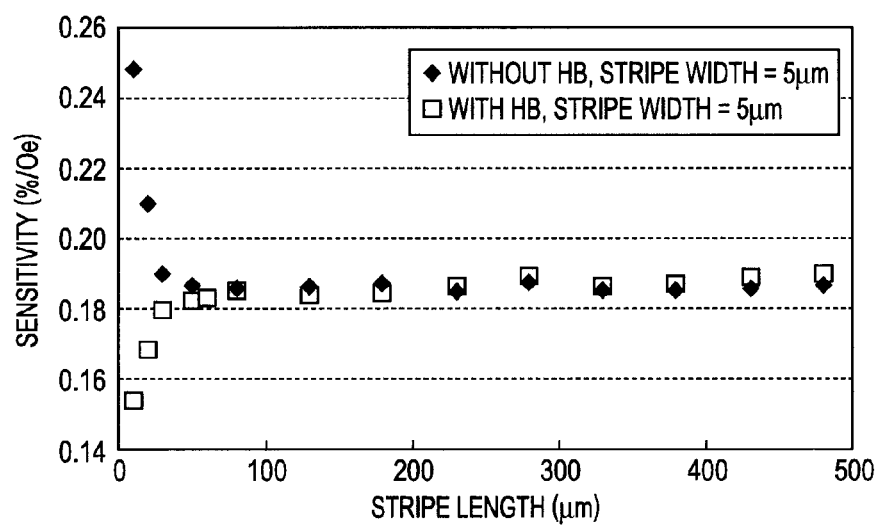
FIG. 4 is a view illustrating the relationship between the stripe length and sensitivity of a magnetoresistance effect element.

Here, in the magnetic sensor having the above-described configuration, the relationship between the stripe length of the magnetoresistance effect element 311 and sensitivity was examined. The result thereof is shown in FIG. 4. In this case, sensitivity was examined when the stripe width of the long pattern was fixed to 5 μm and the stripe length L was varied. Further, the relationship between the stripe length and the sensitivity of the magnetoresistance effect element 311, which has the configuration in which no hard bias layer 313 is provided, was examined. The result thereof is shown in FIG. 4. Furthermore, the sensitivity was set to be a level in the range of ±10 Oe by measuring the variation in the resistance of the magnetoresistance effect element with respect to the external magnetic field.

As shown in FIG. 4, if the stripe length L of the magnetoresistance effect element 311 is short when the hard bias layer 313 exists, the sensitivity decreases due to the hard bias effect. The sensitivity becomes the same as the sensitivity obtained when the stripe length L is 60 μm and the hard bias layer 313 does not exist. When the hard bias layer 313 exists, it is preferable that sensitivity is good. Therefore, it is preferable that the stripe length L of the magnetoresistance effect element 311 be equal to or larger than 60 μm from this viewpoint.

Figure 5:
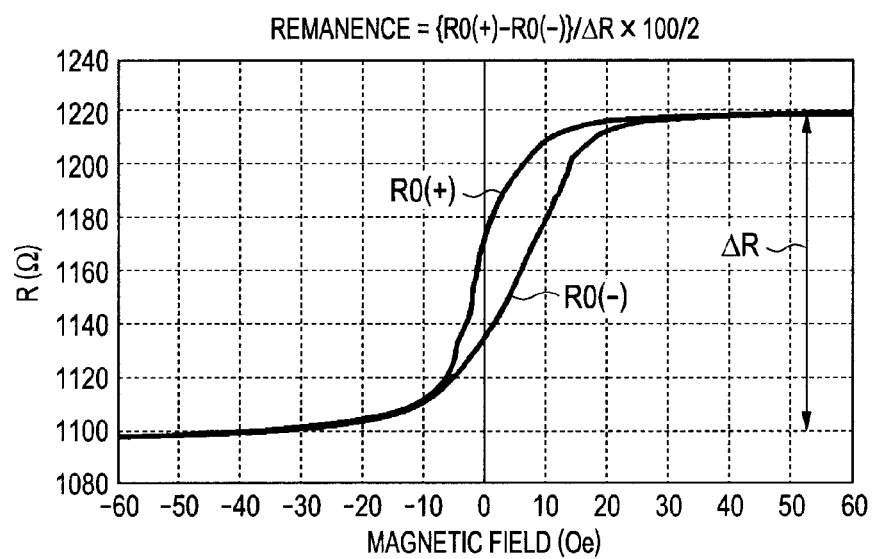
FIG. 5 is a view illustrating remanence.
Figure 6:
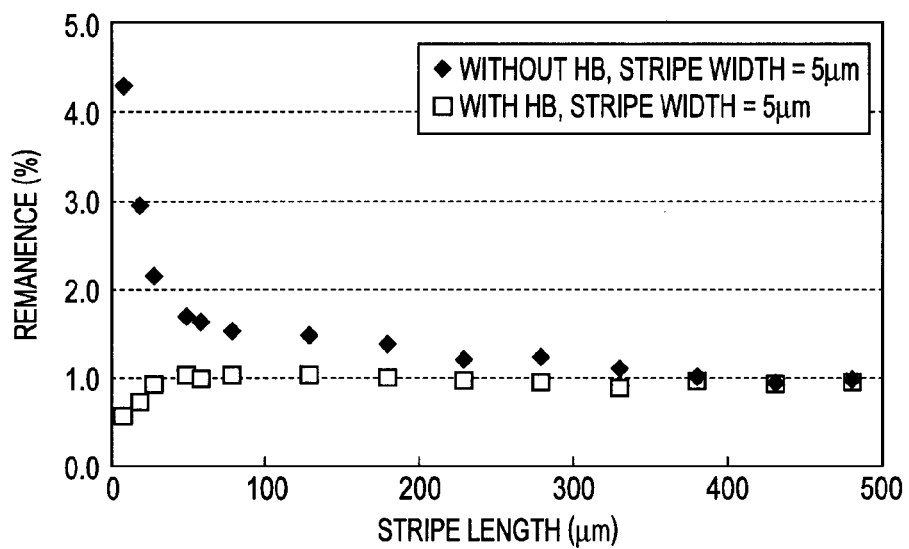
FIG. 6 is a view illustrating the relationship between the stripe length and remanence of the magnetoresistance effect element.

Next, the relationship between the stripe length of the magnetoresistance effect element 311 and remanence was examined. The result thereof is shown in FIG. 6. In this case, remanence was examined when the stripe width of the long pattern was fixed to 5 μm and the stripe length L was varied. Further, the relationship between the stripe length of the magnetoresistance effect element 311, which has the configuration in which the hard bias layer 313 is not provided, and remanence was examined. The result thereof is shown in FIG. 6. The remanence is represented by the ratio of a value with respect to the resistance difference (ΔR) of the magnetoresistance effect element 311, the value being obtained by subtracting resistance (R0(−)), obtained when the (−) magnetic field returns to 0 magnetic field, from the resistance (R0(+)), obtained when the (+) magnetic field returns to 0 magnetic field, as shown in FIG. 5. It is preferable that the remanence be small since hysteresis is small. Furthermore, remanence was calculated by measuring variation in the resistance of the magnetoresistance effect element with respect to the external magnetic field.

As can be understood from FIG. 6, when the hard bias layer 313 exists, if the stripe length L of the magnetoresistance effect element 311 is short, the hard bias layer 313 strongly affects the magnetoresistance effect element 311, so that remanence is small. When the stripe length L of the magnetoresistance effect element 311 is equal to or larger than 50 μm, remanence is saturated. When the stripe length L is equal to or less than 380 μm, an effect in which remanence lowers can be obtained. When the hard bias layer 313 exists, it is desirable that remanence is small, so that it is desirable that the stripe length L of the magnetoresistance effect element 311 is equal to or less than 380 μm from this viewpoint.

As described above, it is preferable that the stripe length (length in the longitudinal direction) L of the magnetoresistance effect element 311 is in the range of 60 μm to 380 μm, and in particular, 60 μm to 180 μm in consideration of sensitivity and remanence (hysteresis).

Figure 7:
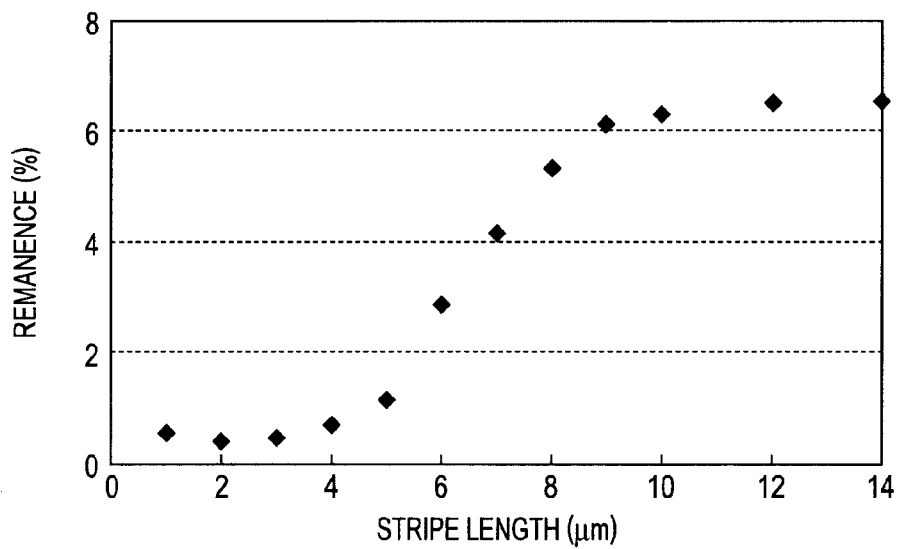
FIG. 7 is a view illustrating the relationship between the stripe width and remanence of the magnetoresistance effect element.

Next, the relationship between the stripe width (the length in the width direction of the long pattern) of the magnetoresistance effect element 311 and remanence was examined. The result thereof is shown in FIG. 7. In this case, remanence was examined when the stripe length L of the long pattern was fixed at 200 μm and the stripe width was varied. Furthermore, remanence was examined using the same manner as the above-described manner.

As can be understood from FIG. 7, remanence became small when the stripe width was equal to or less than 9 μm, and remanence was saturated when the stripe width was 2 μm. Since it is desirable that remanence be small, it is preferable that the stripe width of the magnetoresistance effect element 311 is in the range of 2 μm to 9 μm, and in particular, 2 μm to 5 μm from this viewpoint.

Figure 8:
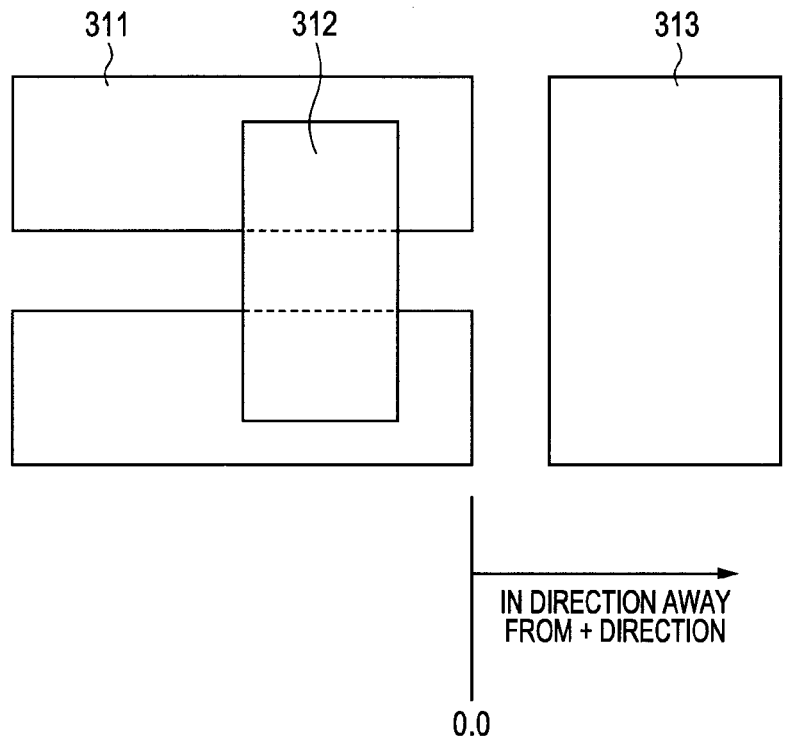
FIG. 8 is a view illustrating a hard bias offset.
Figure 9:
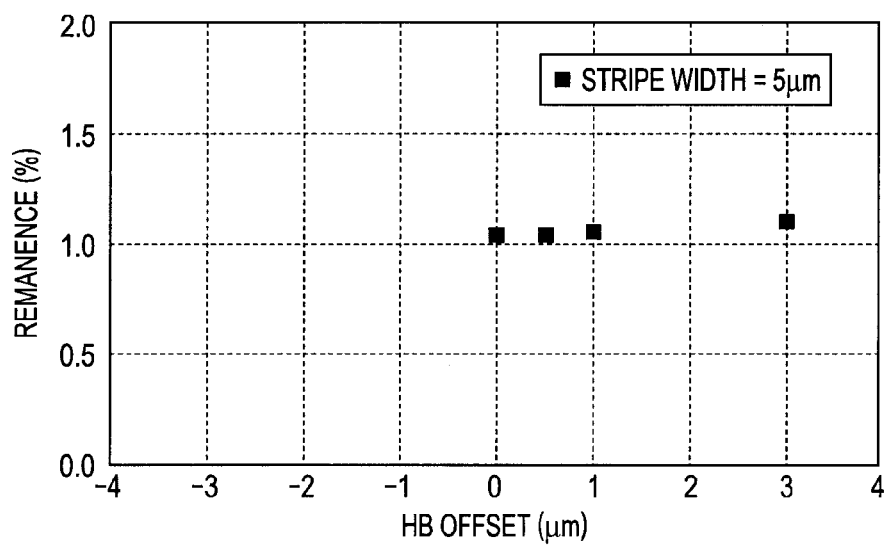
FIG. 9 is a view illustrating the relationship between the hard bias offset and the remanence.

Next, the relationship between the distance of the hard bias layer 313 and the magnetoresistance effect element 311 (hard bias offset amount) and remanence was examined. The result thereof is shown in FIG. 9. The hard bias offset amount refers to the distance from the outermost portion of the magnetoresistance effect element 311 to the hard bias layer 313 as shown in FIG. 8. Furthermore, remanence was measured using the same manner as the above-described manner.

As can be understood from FIG. 9, remanence is not dependent on the hard bias offset amount and is uniform when the hard bias offset amount is a small value equal to or less than 3 μm. It is desirable that remanence is small, so that it is preferable that the hard bias offset amount is equal to or less than 3 μm from this viewpoint.

Figure 10:
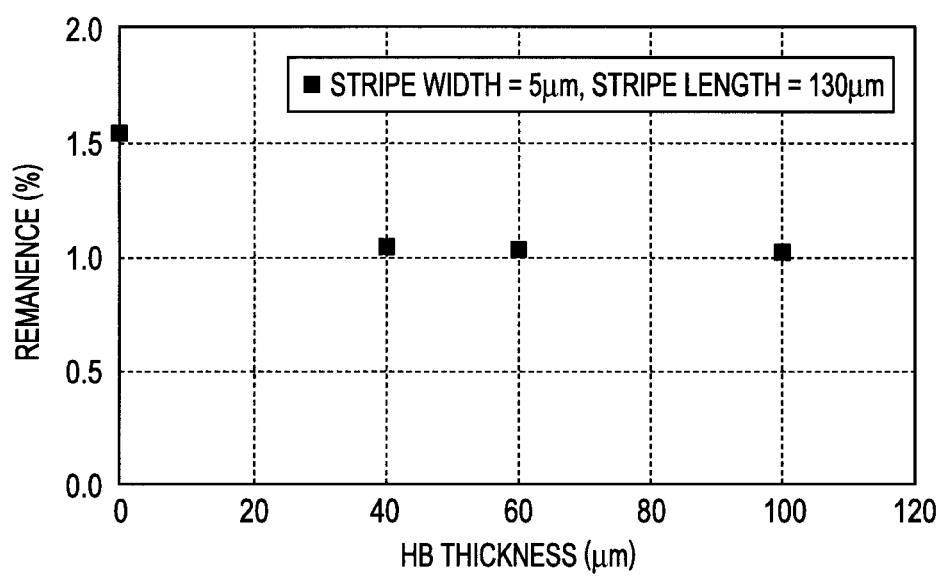
FIG. 10 is a view illustrating the relationship between the thickness of the hard bias layer and the remanence.

Next, the relationship between the thickness of the hard bias layer 313 and remanence was examined. The result thereof is shown in FIG. 10. In this case, remanence was examined when the stripe length L of the long pattern was fixed to 130 μm, the stripe width was fixed to 5 μm, and the thickness of the hard bias layer 313 was varied. Furthermore, remanence was measured using the same manner as the above-described manner.

As can be understood from FIG. 10, remanence became small when the hard bias layer was equal to or larger than 40 nm and this reduction effect was saturated when the thickness was larger than 40 nm. It is desirable that remanence is small, so that it is preferable that the thickness of the hard bias layer is equal to or larger than 40 nm from this viewpoint.

In the magnetic sensor including the above-described configuration, the hard bias layers are disposed in the longitudinal direction of the striped form, and disposed outside of the magnetoresistance effect element to be separated from the magnetoresistance effect element, so that heat generation and short-circuiting of the hard bias layers can be prevented. Further, the magnetic sensor according to the embodiment of the invention includes the hard bias layers, so that temperature characteristics thereof are excellent.

Figure 11:
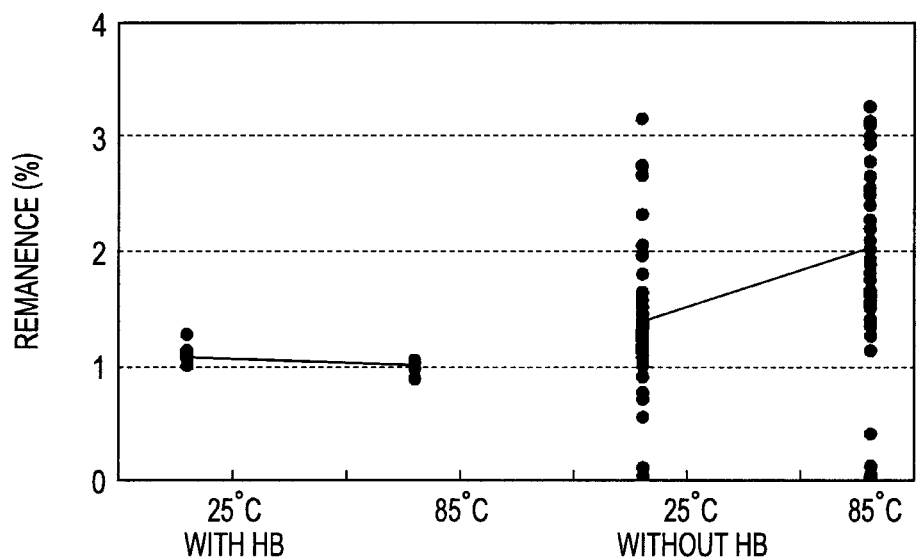
FIG. 11 is a view illustrating the temperature characteristics of the remanence.

Here, the results of the comparison of remanence estimated at 25° C. and 85° C. according to the existence/non-existence of the hard bias layers are shown in FIG. 11. FIG. 11 plots on 24 chips. As can be understood from FIG. 11, the variation in remanence was small when the hard bias layers existed, and the variation in remanence was considerably large when the hard bias layers did not exist. Further, the average of remanence became large at the high temperature side when the hard bias layers did not exist, and the average of remanence became small at the high temperature side when the hard bias layers existed. Based on these results, preparing the hard bias layer is advantageous from the viewpoint of temperature characteristics.

In the magnetic balance type current sensor including the above-described configuration, the induction magnetic field generated from the measured current I is received by the magnetoresistance effect element, the canceling magnetic field is generated from the feedback coil in such a way that the induction magnetic field is fed back, and the magnetic field to be applied to the magnetoresistance effect element is appropriately adjusted to be 0 by offsetting the two magnetic fields (the induction magnetic field and the cancel magnetic field).

Figure 12A:
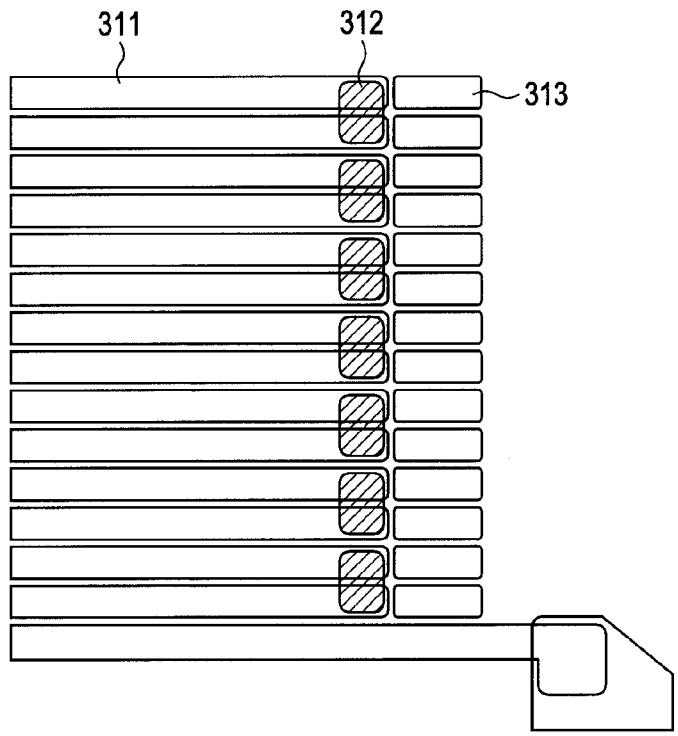
FIGS. 12A and 12B are views illustrating other examples of the magnetic sensor according to an embodiment of the invention.
Figure 12B:
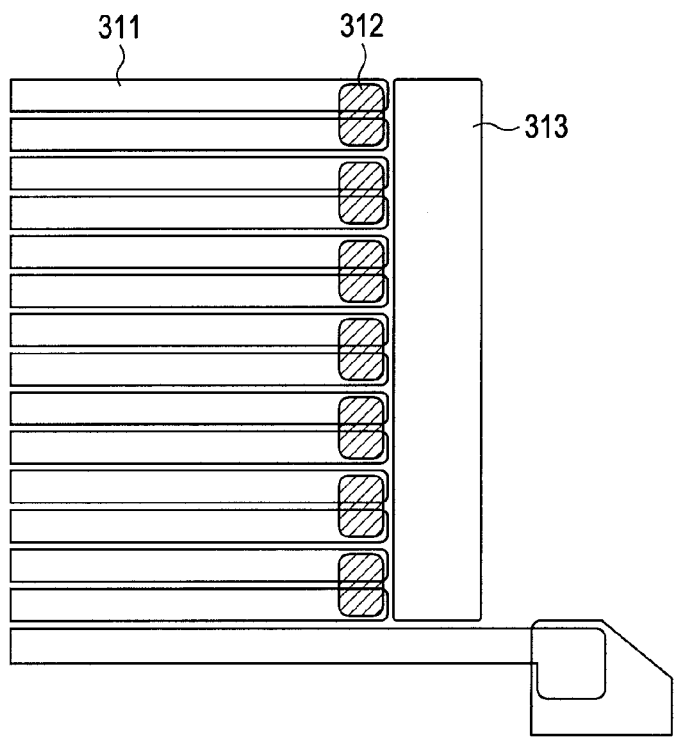

The hard bias layer 313 disposed on the outside of the magnetoresistance effect element 311 is not limited to the embodiment shown in FIGS. 3A and 3B, and may be disposed on the outside of the magnetoresistance effect element 311 in the longitudinal direction of the striped form and the shape and size thereof are not limited. For example, the hard bias layer may be disposed on each of the long patterns with the same width as the width (stripe width) of one of the long patterns of the magnetoresistance effect element 311 as shown in FIG. 12A, and may be disposed across the region in which the magnetoresistance effect element 311 exists as shown in FIG. 12B. However, with respect to the hard bias layer 313, it is preferable that the size of the stripe width direction (lengthwise direction in the plane of paper in the drawing (sensitivity axis direction)) be equal to or larger than the stripe width such that magnetic flux is uniformly applied to the longitudinal direction of the long patterns.

The embodiment of the invention is not limited to the above-described embodiments and can be implemented through various modifications. For example, the material, connectional relationship between respective elements, thickness, size, and processes in the above-described embodiments can be implemented through appropriate modifications. In addition, the embodiments of the invention can be implemented through appropriate modifications without departing from the scope of the invention.

What is claimed is:

1. A magnetic sensor, comprising:
 a magnetoresistance effect element formed in a striped form and having a sensitivity axis in a predetermined direction, the magnetoresistance effect element having a laminated structure including:
  a free magnetic layer whose magnetization varies with respect to an external magnetic field applied thereto;
  a non-magnetic layer; and
  a fixed magnetic layer whose magnetization is fixed; and
 a hard bias layer disposed outside of the magnetoresistance effect element in a longitudinal direction of the striped form,
 wherein the hard bias layer is separated from the magnetoresistance effect element by a distance in the longitudinal direction without overlapping therewith.

2. The magnetic sensor according to claim 1, wherein a length of the longitudinal direction of the magnetoresistance effect element is in a range of 60 μm to 380 μm.

3. The magnetic sensor according to claim 1, wherein a length of a width direction of the magnetoresistance effect element is in a range of 2 μm to 9 μm.

4. The magnetic sensor according to claim 1, wherein the distance between the hard bias layer and the magnetoresistance effect element is equal to or less than 3 μm.

5. The magnetic sensor according to claim 1, wherein a thickness of the hard bias layer is equal to or larger than 40 nm.

6. The magnetic sensor according to claim 1, wherein the magnetoresistance effect element is a spin valve type Giant Magneto Resistance (GMR) element or a spin valve type Tunnel Magneto Resistance (TMR) element.

7. A magnetic balance type current sensor comprising:
 a magnetic sensor according to claim 1 of which characteristics vary due to an induction magnetic field from measured current; and
 a feedback coil which is disposed adjacent to the magnetic sensor, and configured to generate a canceling magnetic field which offsets the induction magnetic field.

* * * * *